(12) United States Patent
Smalc et al.

(10) Patent No.: US 7,292,441 B2
(45) Date of Patent: *Nov. 6, 2007

(54) THERMAL SOLUTION FOR PORTABLE ELECTRONIC DEVICES

(75) Inventors: Martin David Smalc, Parma, OH (US); Gary D. Shives, Brunswick, OH (US); Robert Anderson Reynolds, III, Bay Village, OH (US)

(73) Assignee: Advanced Energy Technology Inc., Parma, OH (US)

( * ) Notice: Subject to any disclaimer, the term of this patent is extended or adjusted under 35 U.S.C. 154(b) by 214 days.

This patent is subject to a terminal disclaimer.

(21) Appl. No.: 11/176,596

(22) Filed: Jul. 7, 2005

(65) Prior Publication Data

US 2006/0126304 A1 Jun. 15, 2006

Related U.S. Application Data (63) Continuation-in-part of application No. 10/722,364, filed on Nov. 25, 2003, now Pat. No. 6,982,874.

(51) Int. Cl.
*H05K 7/20* (2006.01)

(52) U.S. Cl. ............. 361/704; 361/688; 361/719; 165/185

(58) Field of Classification Search ............. None
See application file for complete search history.

(56) References Cited

U.S. PATENT DOCUMENTS

| | | | |
|---|---|---|---|
| 3,404,061 A | 10/1968 | Shane et al. | 161/125 |
| 4,878,152 A | 10/1989 | Sauzade et al. | 361/721 |
| 4,895,713 A | 1/1990 | Greinke et al. | 423/448 |
| 5,153,590 A * | 10/1992 | Charlier | 341/31 |
| 5,224,030 A | 6/1993 | Banks et al. | 361/717 |
| 5,390,734 A | 2/1995 | Voorhes et al. | 165/185 |
| 5,825,624 A | 10/1998 | Arnold et al. | 361/708 |
| 5,902,762 A | 5/1999 | Mercuri et al. | 501/99 |
| 5,930,115 A | 7/1999 | Tracy et al. | 361/704 |
| 5,991,155 A | 11/1999 | Kobayashi et al. | 361/705 |
| 6,090,484 A | 7/2000 | Bergerson | 428/355 |
| 6,105,662 A | 8/2000 | Suzuki | 165/104.3 |
| 6,131,651 A | 10/2000 | Richey | 165/185 |
| 6,245,400 B1 | 6/2001 | Tzeng et al. | 428/40.1 |
| 6,257,328 B1 | 7/2001 | Fujiwara et al. | 165/185 |
| 6,311,077 B1 * | 10/2001 | Bien | 455/566 |
| 6,482,520 B1 | 11/2002 | Tzeng | 428/408 |
| 6,503,626 B1 | 1/2003 | Norley et al. | 428/408 |

(Continued)

FOREIGN PATENT DOCUMENTS

JP 2003008263 1/2003

OTHER PUBLICATIONS

WO 03/001133, Jan. 3, 2003, PCT/US02/19925.

(Continued)

*Primary Examiner*—Boris Chervinsky
(74) *Attorney, Agent, or Firm*—Waddey & Patterson; James R. Cartiglia (57) ABSTRACT

A thermal solution for a portable electronic device, which is positioned between a heat source and another component of the electronic device, where the thermal solution facilitates heat dissipation from the heat source while shielding the second component from the heat generated by the heat source.

17 Claims, 3 Drawing Sheets

U.S. PATENT DOCUMENTS

| | | |
|---|---|---|
| 6,538,892 B2 | 3/2003 | Smalc .................... 361/710 |
| 6,771,495 B2 | 8/2004 | Fujiwara et al. ............ 361/685 |
| 2005/0039879 A1 | 2/2005 | Hanai |
| 2005/0175838 A1 | 8/2005 | Greinke et al. |

OTHER PUBLICATIONS

Japanese Patent Application JP2003008263, Jan. 10, 2003, Heat Conduction Member and Electronic Device Having Heat Conduction Member (Abstract Only).

International Publication No. WO 02/096615 A1 published Jul. 17, 2003, (PCT/US02/16730).

International Publication No. WO 03/051772 A1 published Jun. 26, 2003, (PCT/US02/39749).

International Publication No. WO 03/057475 A1 published Jul. 17, 2003, (PCT/US02/40238).

Japan Patent Publication Hei 10-56114, JP1998056114A, Feb. 24, 1998.

Japan Patent Publication Hei 11-179830, JP1999179830A, Jul. 6, 1999.

Japan Unexamined Patent Publication—JP2004023065A, Jan. 22, 2004.

Japan Unexamined Patent Publication—JP2004023066A, Jan. 22, 2004.

DXX03-013 Tokugan 2003-382882, Application date Nov. 12, 2003.

DXX03-022 Tokugan 2003-375005, Application date Nov. 4, 2003.

DXX03-031 Tokugan 2004-017710, Application date Jan. 26, 2004.

* cited by examiner

THERMAL SOLUTION FOR PORTABLE ELECTRONIC DEVICES

This application is a continuation-in-part of U.S. patent application Ser. No. 10/722,364, filed Nov. 25, 2003 now U.S. Pat. No. 6,982,874.

TECHNICAL FIELD

The present invention relates to a thermal solution capable of thermally shielding components in an electronic device, so as prevent or reduce the effects of the heat on device components.

BACKGROUND OF THE INVENTION

With the development of more and more sophisticated electronic devices, including those capable of increasing processing speeds and higher frequencies, having smaller size and more complicated power requirements, and exhibiting other technological advances, such as laptop computers, cell phones, personal digital assistants (PDAs) and related portable devices, as well as in other devices where components are arrayed in close proximity to each other, relatively extreme temperatures can be generated. For instance, power amplifiers and digital signal processors can generate significant heat, especially in cell phones. However, these components, as well as batteries, microprocessors, integrated circuits and other sophisticated electronic components typically operate efficiently only under a certain range of threshold temperatures. The excessive heat generated during operation of these components can not only harm their own performance, but can also degrade the performance and reliability of other system components and the overall system and can even cause system failure. The increasingly wide range of environmental conditions, including temperature extremes, in which electronic systems are expected to operate, exacerbates the negative effects of excessive heat.

With the increased need for heat dissipation from microelectronic devices, thermal management becomes an increasingly important element of the design of electronic products. Both performance reliability and life expectancy of electronic equipment are inversely related to the component temperature of the equipment. For instance, a reduction in the operating temperature of a device such as a typical silicon semiconductor, or, similarly, of the temperatures to which the semiconductor is exposed from other components, can correspond to an increase in the processing speed, reliability and life expectancy of the device. Therefore, to maximize the life-span and reliability of a component, controlling the temperature to which components are exposed can be of paramount importance.

Although it is feasible to simply insulate heat-generating components in an electronic device, doing so can be disadvantageous. Insulating a heat source keeps the heat generated by the heat source in and around the component generating the heat. Thus, it increases the thermal load on that component, which can reduce the operating effectiveness or life of the component. Accordingly, the heat generated by one component in a system needs to be channeled or spread away from the heat-generating component, as well as shielded from other components of the device.

One group of relatively light weight materials suitable for use in the dissipation of heat from heat sources such as electronic components are those materials generally known as graphites, but in particular graphites such as those based on natural graphites and flexible graphite as described below. These materials are anisotropic and allow thermal dissipation devices to be designed to preferentially transfer heat in selected directions. The graphite materials are much lighter in weight and thus provide many advantages over copper or aluminum.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size: the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional e.g. thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal and electrical conductivity and fluid diffusion, comparable to the natural graphite starting material due to orientation of the expanded graphite particles and graphite layers substantially parallel to the opposed faces of the sheet resulting from very high compression, e.g. roll pressing. Sheet material thus produced has excellent flexibility, good strength and a very high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 g/cm$^3$ to about 2.0 g/cm$^3$. The flexible graphite sheet material exhibits an appreciable degree of anisotropy due to the alignment of graphite particles parallel to the major opposed, parallel surfaces of the sheet, with the degree of anisotropy increasing upon roll pressing of the sheet material to increase orientation. In roll pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal, electrical and fluid diffusion properties of the sheet are very different, by orders of magnitude, for the "c" and "a" directions.

While the use of sheets of compressed particles of exfoliated graphite (i.e., flexible graphite) has been suggested as thermal spreaders, thermal interfaces and as component parts of heat sinks for dissipating the heat generated by a heat source (see, for instance, U.S. Pat. Nos. 6,245,400; 6,482,520; 6,503,626; and 6,538,892), the issues of "touch temperature," that is the heating of external surfaces of an electronic device to the extent that the user is discomfited or endangered, and heating of adjacent components have not adequately been addressed.

Accordingly, there is a continuing need for improved designs for thermal solutions for electronic components of portable or miniaturized devices such as laptop computers, cell phones and PDAs, where the heat from one component needs to be blocked from effecting neighboring components, while also being spread or dissipated.

SUMMARY OF THE INVENTION

The present invention provides a thermal solution capable of dissipating the heat from a heat-generating electronic component while simultaneously shielding other, especially adjacent, components from the effects of the heat generated by the heat-generating component. The inventive thermal solution comprises at least one anisotropic sheet of compressed particle of exfoliated graphite (also referred to herein as "flexible graphite"). As used herein, the term "flexible graphite" also refers to sheets of pyrolytic graphite, either singly or as a laminate. The flexible graphite sheet employed as the thermal solution of the present invention has an in-plane thermal conductivity substantially higher than its through-plane thermal conductivity. In other words, the thermal solution of the present invention has a relatively high (on the order of 10 or greater) thermal anisotropic ratio. The thermal anisotropic ratio is the ratio of in-plane thermal conductivity to through-plane thermal conductivity.

The thermal solution comprises two major surfaces, one of which can be in operative contact with a surface of the heat source, like a hard drive or processor (the terms "operative contact" and "direct operative contact" as used in the electronic thermal management industry refer to a thermal spreader, thermal interface, heat sink or the like being in position such that heat from a heat source is transferred to such thermal spreader, thermal interface, heat sink or the like). The area of the thermal solution is greater than that of the area of contact of the thermal solution on the heat source, such that the in-plane thermal conductivity of the thermal solution acts to dissipate or spread heat from the heat source. Alternatively, the inventive thermal solution can be arrayed in the device, such that one or more components of the device are shielded from heat generated within the device, even where the thermal solution is not in operative contact or direct operative contact with the source of the heat.

Due to the relatively low through-thickness thermal conductivity (or, put another way, high thermal anisotropic ratio), the heat generated is not as readily transferred through the thickness of the thermal solution (that is, in the direction between the two major surfaces). Thus, when the thermal solution is positioned between the heat source and another component in the device in which the heat source is located, the thermal solution reduces or eliminates heat flow from the heat source to the other component. The conformable nature of the thermal solution of the present invention permits its use even in applications where space is limited, such as cell phones, PDAs and the like.

In addition, another benefit of the use of a flexible graphite material as the inventive thermal solution lies in the ability of graphitic materials to block electromagnetic and radio frequency (EMI/RF) interference. It is believed that the thermal solutions of this invention will function to shield components of the device in which it is positioned from EMI/RF interference, in addition to performing the thermal dissipation/shielding function that is its primary purpose.

In another embodiment of the invention, the thermal solution can have a layer of aluminum or other isotropic conductor like copper laminated or coated thereon so as to be interposed between the thermal solution and device components to improve handleability and mechanical robustness of the thermal solution, as well as to modify the thermal transfer and EMI/RF shielding characteristics of the thermal solution. Likewise, a thermal interface material, such as a thermal grease or a graphite-based thermal interface like that described in International Patent Application No. PCT/US02/40238 and/or commercially available from Advanced Energy Technology Inc. of Lakewood, Ohio as its eGraf Hi-Therm™ line of products can be interposed between the thermal solution and a heat source to facilitate heat transfer between the heat source and the inventive thermal solution. In yet another embodiment, a reflective material can be employed on one of the surfaces of the thermal solution, which can then be positioned under the keypad of a cell phone or PDA to shield the keypad and user from heat generated within the device as well as improve the visibility of the keypad. Still another embodiment of the invention positions the thermal solution between layers of the printed circuit board ("PCB") of the device, in order to shield components on one side of the PCB (either integral with the PCB or adjacent thereto) from heat generated at or on the other side of the PCB.

In addition, in order to improve mechanical robustness and handleability of the thermal solution, and potentially to further block or shield heat from being transmitted to shielded components, a layer of a relatively thermally nonconductive material such as a plastic like Mylar® material or other resins or like materials can be overlaid on the thermal solution.

The use of a layer of aluminum, plastic, etc. on one or both of the major surfaces of the thermal solution can have an additional advantage. Although they are not believed to be well-founded, fears have been expressed that the use of a graphite component within an electronic device can lead to problems due to flaking of graphite particles from the graphite component. The aluminum, plastic, etc. can also function or cooperate to encase the graphite thermal solution, thus eliminating any practical possibility of graphite flaking.

Accordingly, it is an object of the present invention to provide an improved thermal solution for shielding components of an electronic device from heat generated or present in the device.

Still another object of the present invention is the provision of a thermal solution having a sufficiently high thermal anisotropic ratio to function effectively for heat dissipation while avoiding heat transfer to adjacent structures.

Yet another object of the present invention is the provision of a conformable thermal solution which provides both heat dissipation and heat blocking (or shielding) in an environment where available space is limited.

These objects and others which will be apparent to the skilled artisan upon reading the following description, can be achieved by providing a thermal dissipation and shielding system for an electronic device (such as a laptop computer, cell phone, PDA or other portable device), where the device includes a first component (such as a power amplifier, digital signal processor or hard drive) which generates heat which could potentially be transmitted to a second component of the device (such as a battery, chipset or liquid crystal display or other type of display panel); and a thermal solution having two major surfaces, the thermal solution positioned such that one of its major surfaces is in operative contact with the first component such that it is interposed between the first component and the second component, where the thermal solution comprises at least one sheet of flexible graphite. By "operative contact" is meant that heat from the heat source is transferred to the thermal solution, even if there is no direct physical contact between the heat source and the thermal solution. The thermal solution preferably has an in-plane thermal conductivity of at least about 140 W/m° K, more preferably at least about 200 W/m° K and a through-plane thermal conductivity of no greater than about 12 W/m° K, more preferably no greater than about 10 W/m° K.

In the most preferred embodiment, the inventive system further includes a heat dissipation device, such as a heat sink, heat pipe, heat plate or combinations thereof, positioned in a location not directly adjacent to the first component and further wherein one of the major surfaces of the thermal solution is in operative contact with the heat dissipation device.

In another embodiment of the invention the thermal solution can have a protective coating, such as a plastic, thereon. Most preferably, the protective coating has a thermal conductivity less than the through-plane thermal conductivity of the at least one sheet of flexible graphite. A thermal transfer material, like a metal or a thermal interface, can also be positioned between the thermal solution and the first component.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operations of the invention.

BRIEF DESCRIPTION OF THE DRAWINGS

FIG. 2b is a perspective view of the thermal solution embodiment of FIG. 1 positioned in situ in the cell phone of FIG. 2a.

DETAILED DESCRIPTION OF THE PREFERRED EMBODIMENTS

As noted, the inventive thermal solution is formed from sheets of compressed particles of exfoliated graphite, commonly known as flexible graphite. Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as graphite prepared by chemical vapor deposition, high temperature pyrolysis of polymers, or crystallization from molten metal solutions and the like. Natural graphite is most preferred.

The graphite starting materials used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has a purity of at least about eighty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed. Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1,10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_n COOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thusly treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes.

Flexible graphite sheet and foil are coherent, with good handling strength, and are suitably compressed, e.g. by roll pressing, to a thickness of about 0.075 mm to 3.75 mm and a typical density of about 0.1 to 1.5 grams per cubic centimeter (g/cm$^3$). From about 1.5-30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The above described methods for intercalating and exfoliating graphite flake may beneficially be augmented by a pretreatment of the graphite flake at graphitization temperatures, i.e. temperatures in the range of about 3000° C. and above and by the inclusion in the intercalant of a lubricious additive, as described in International Patent Application No. PCT/US02/39749.

The pretreatment, or annealing, of the graphite flake results in significantly increased expansion (i.e., increase in expansion volume of up to 300% or greater) when the flake is subsequently subjected to intercalation and exfoliation. Indeed, desirably, the increase in expansion is at least about 50%, as compared to similar processing without the annealing step. The temperatures employed for the annealing step should not be significantly below 3000° C., because temperatures even 100° C. lower result in substantially reduced expansion.

The annealing of the present invention is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step of the instant invention may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calender station conventionally used for compressing (or "calendering") graphite worms into flexible graphite sheet. The resulting sheet therefore has higher area weight uniformity and greater tensile strength. The lubricious additive is preferably a long chain hydrocarbon, more preferably a hydrocarbon having at least about 10 carbons. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricous additive is not as critical as the lower limit, there does not appear to be any significant additional advantage to including the lubricious additive at a level of greater than about 4 pph.

The thus treated particles of graphite are sometimes referred to as "particles of intercalated graphite." Upon exposure to high temperature, e.g. temperatures of at least about 160° C. and especially about 700° C. to 1200° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact as hereinafter described.

Flexible graphite sheet and foil are coherent, with good handling strength, and are suitably compressed, e.g. by roll-pressing, to a thickness of about 0.075 mm to 3.75 mm and a typical density of about 0.1 to 1.5 grams per cubic centimeter (g/cc). From about 1.5-30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The flexible graphite sheet can also, at times, be advantageously treated with resin and the absorbed resin, after curing, enhances the moisture resistance and handling strength, i.e. stiffness, of the flexible graphite sheet as well as "fixing" the morphology of the sheet. Suitable resin content is preferably at least about 5% by weight, more preferably about 10 to 35% by weight, and suitably up to about 60% by weight. Resins found especially useful in the practice of the present invention include acrylic-, epoxy- and phenolic-based resin systems, fluoro-based polymers, or mixtures thereof Suitable epoxy resin systems include those based on diglycidyl ether of bisphenol A (DGEBA) and other multifunctional resin systems; phenolic resins that can be employed include resole and novolac phenolics. Optionally, the flexible graphite may be impregnated with fibers and/or salts in addition to the resin or in place of the resin. Additionally, reactive or non-reactive additives may be employed with the resin system to modify properties (such as tack, material flow, hydrophobicity, etc.).

Alternatively, the flexible graphite sheets of the present invention may utilize particles of reground flexible graphite sheets rather than freshly expanded worms, as discussed in International Patent Application No. PCT/US02/16730. The sheets may be newly formed sheet material, recycled sheet material, scrap sheet material, or any other suitable source.

Also the processes of the present invention may use a blend of virgin materials and recycled materials.

The source material for recycled materials may be sheets or trimmed portions of sheets that have been compression molded as described above, or sheets that have been compressed with, for example, pre-calendering rolls, but have not yet been impregnated with resin. Furthermore, the source material may be sheets or trimmed portions of sheets that have been impregnated with resin, but not yet cured, or sheets or trimmed portions of sheets that have been impregnated with resin and cured. The source material may also be recycled flexible graphite proton exchange membrane (PEM) fuel cell components such as flow field plates or electrodes. Each of the various sources of graphite may be used as is or blended with natural graphite flakes.

Once the source material of flexible graphite sheets is available, it can then be comminutted by known processes or devices, such as a jet mill, air mill, blender, etc. to produce particles. Preferably, a majority of the particles have a diameter such that they will pass through 20 U.S. mesh; more preferably a major portion (greater than about 20%, most preferably greater than about 50%) will not pass through 80 U.S. mesh. Most preferably the particles have a particle size of no greater than about 20 mesh. It may be desirable to cool the flexible graphite sheet when it is resin-impregnated as it is being committed to avoid heat damage to the resin system during the comminution process.

The size of the committed particles may be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane electrical and thermal conductivity.

If the source material has been resin impregnated, then preferably the resin is removed from the particles. Details of the resin removal are further described below.

Once the source material is comminuted, and any resin is removed, it is then re-expanded. The re-expansion may occur by using the intercalation and exfoliation process described above and those described in U.S. Pat. No. 3,404,061 to Shane et al. and U.S. Pat. No. 4,895,713 to Greinke et al.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into flexible sheets, as hereinafter described.

If the starting material has been impregnated with a resin, the resin should preferably be at least partially removed from the particles. This removal step should occur between the comminuting step and the re-expanding step.

In one embodiment, the removing step includes heating the resin containing regrind particles, such as over an open flame. More specifically, the impregnated resin may be heated to a temperature of at least about 250° C. to effect resin removal. During this heating step care should be taken to avoid flashing of the resin decomposition products; this can be done by careful heating in air or by heating in an inert atmosphere. Preferably, the heating should be in the range of from about 400° C. to about 800° C. for a time in the range of from at least about 10 and up to about 150 minutes or longer.

Additionally, the resin removal step may result in increased tensile strength of the resulting article produced from the molding process as compared to a similar method in which the resin is not removed. The resin removal step may also be advantageous because during the expansion step (i.e., intercalation and exfoliation), when the resin is mixed with the intercalation chemicals, it may in certain instances create toxic byproducts.

Thus, by removing the resin before the expansion step a superior product is obtained such as the increased strength characteristics discussed above. The increased strength characteristics are a result of in part because of increased expansion. With the resin present in the particles, expansion may be restricted.

In addition to strength characteristics and environmental concerns, resin may be removed prior to intercalation in view of concerns about the resin possibly creating a run away exothermic reaction with the acid.

In view of the above, preferably a majority of the resin is removed. More preferably, greater than about 75% of the resin is removed. Most preferably, greater than 99% of the resin is removed.

Once the flexible graphite sheet is committed, it is formed into the desired shape and then cured (when resin impregnated) in the preferred embodiment. Alternatively, the sheet can be cured prior to being committed, although post-commutation cure is preferred.

Optionally, the flexible graphite sheet used to form the inventive thermal solution can be used as a laminate, with or without an adhesive between laminate layers. Non-graphite layers may be included in the laminate stack, although this may necessitate the use of adhesives, which can be disadvantageous, as discussed above. Such non-graphite layers may include metals, plastics or other non-metallics such as fiberglass or ceramics.

As noted above, the thusly-formed sheets of compressed particles of exfoliated graphite are anisotropic in nature; that is, the thermal conductivity of the sheets is greater in the in-plane, or "a" directions, as opposed to the through-sheet, or "c" direction. In this way, the anisotropic nature of the graphite sheet directs the heat along the planar direction of the thermal solution (i.e., in the "a" direction along the graphite sheet). Such a sheet generally has a thermal conductivity in the in-plane direction of at least about 140, more preferably at least about 200, and most preferably at least about 250 W/m° K and in the through-plane direction of no greater than about 12, more preferably no greater than about 10, and most preferably no greater than about 6 W/m° K. Thus, the thermal solution has a thermal anistropic ratio (that is, the ratio of in-plane thermal conductivity to through-plane thermal conductivity) of no less than about 10.

The values of thermal conductivity in the in-plane and through-plane directions of the laminate can be manipulated by altering the directional alignment of the graphene layers of the flexible graphite sheets used to form the thermal solution, including if being used to form a laminate, or by altering the directional alignment of the graphene layers of the laminate itself after it has been formed. In this way, the in-plane thermal conductivity of the thermal solution is increased, while the through-plane thermal conductivity of the thermal solution is decreased, this resulting in an increase of the thermal anisotropic ratio.

One of the ways this directional alignment of the graphene layers can be achieved is by the application of pressure to the component flexible graphite sheets, either by calendering the sheets (i.e., through the application of shear force) or by die pressing or reciprocal platen pressing (i.e., through the application of compaction), with calendering more effective at producing directional alignment. For instance, by calendering the sheets to a density of 1.7 g/cc, as opposed to 1.1 g/cc, the in-plane thermal conductivity is increased from about 240 W/m° K to about 450 W/m° K or higher, and the through-plane thermal conductivity is decreased proportionally, thus increasing the thermal anisotropic ratio of the individual sheets and, by extension, any laminate formed therefrom.

Alternatively, if a laminate is formed, the directional alignment of the graphene layers which make up the laminate in gross is increased, such as by the application of pressure, resulting in a density greater than the starting density of the component flexible graphite sheets that make up the laminate. Indeed, a final density for the laminated article of at least about 1.4 g/cc, more preferably at least about 1.6 g/cc, and up to about 2.0 g/cc can be obtained in this manner. The pressure can be applied by conventional means, such as by die pressing or calendering. Pressures of at least about 60 megapascals (MPa) are preferred, with pressures of at least about 550 MPa, and more preferably at least about 700 MPa, needed to achieve densities as high as 2.0 g/cc.

Surprisingly, increasing the directional alignment of the graphene layers can increase the in-plane thermal conductivity of the graphite laminate to conductivities which are equal to or even greater than that of pure copper, while the density remains a fraction of that of pure copper. Additionally, the resulting aligned laminate also exhibits increased strength, as compared to a non-"aligned" laminate.

Figure 1:
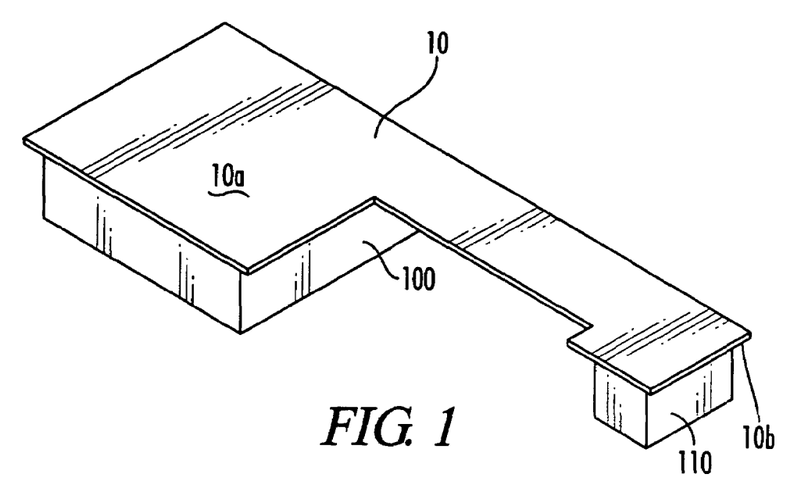
FIG. 1 is a perspective view of a first embodiment of the thermal solution of the present invention disposed to bridge a heat source and a heat sink.

Referring now to the drawings, and particularly to FIG. 1, an embodiment of the thermal solution of the present invention is shown and generally designated by the numeral 10. Thermal solution 10 comprises a sheet of compressed particles of exfoliated graphite, having two major surfaces, denoted 10a and 10b. One of major surfaces 10a or 10b of thermal solution 10 is sized to be positioned in operative contact with a heat source, denoted 100, such as an electronic component like a chipset of a cellular phone, such that heat generated by heat source 100 dissipates into thermal solution 10. The area of the major surface 10a or 10b which is in contact with heat source 100 is greater than the area of contact with heat source 100, so that thermal solution 10 spreads the heat from heat source 100.

Furthermore, one of the major surfaces 10a or 10b of thermal solution 10 can be in operative contact with a heat dissipation device 110, such as a heat sink, heat pipe, heat plate, etc. Heat dissipation device 110 can contact thermal solution 10 on either the same major surface 10a or 10b as heat source 100. Because of the anisotropic nature of thermal solution 10, heat from heat source 100 is thereby spread to heat dissipation device 110 to thus dissipate the heat generated. In this way, thermal solution acts to as a heat spreader to spread the heat generated by heat source 100, including spreading the heat to heat dissipation device 110.

Because of the relatively high thermal anisotropic ratio of thermal solution 10, however, heat from heat source 100 is not effectively transmitted through the plane of thermal solution 10 from the one of major surfaces 10a or 10b in operative contact with heat source 100 to the other. Therefore, heat is not effectively transmitted to another component within the device in which heat source 100 is located (such as a cellular phone), reducing the temperature to which such other component is exposed, when thermal solution 10 is disposed between heat source 10 and such other component (it will be recognized that, unless thermal solution 10 is used in conjunction with a heat sink or other thermal dissipation device, thermal solution 10 acts to spread the heat generated by heat source 100 as well as to at least temporarily shield another component from the heat but heat dissipation will be slowed as compared to the use of a heat sink or other thermal dissipation device).

Figure 2A:
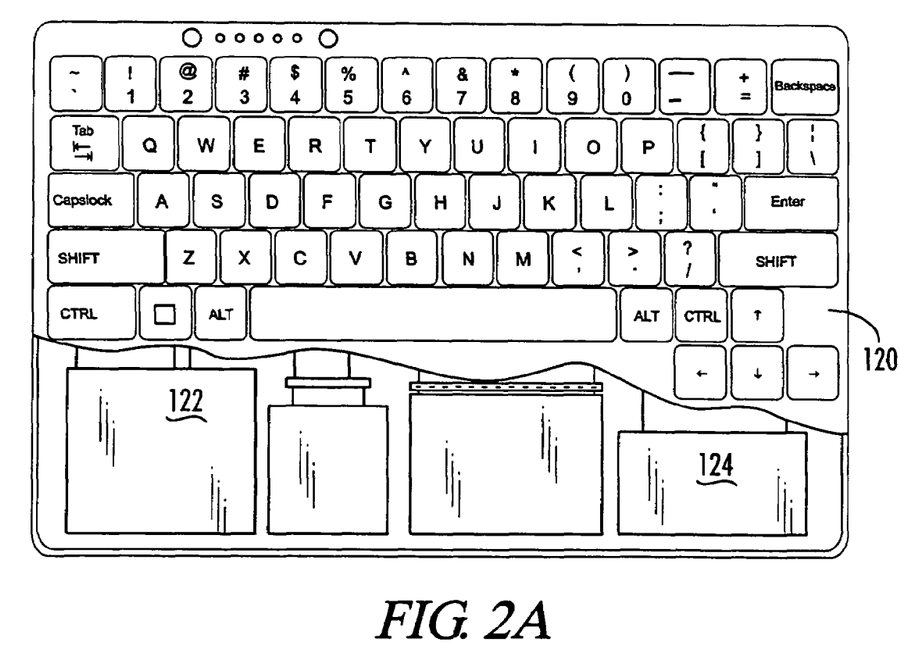
FIG. 2a is a perspective view of a cell phone having part of its case removed.
Figure 2B:
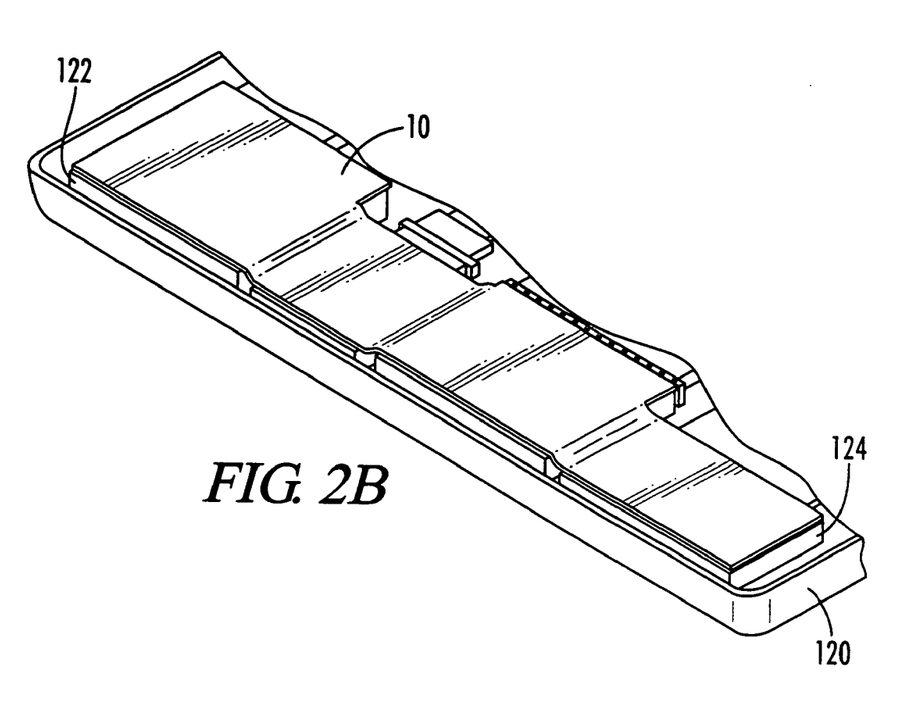

FIGS. 2a and 2b illustrate the positioning of thermal solution 10 in a laptop computer 120 to accomplish the advantageous aspect of the inventive design. As seen in FIG. 2a, laptop computer 120 may have, within its case, a number of components, including one or more heat generating components, denoted 122. In addition, laptop computer 120 may have heat dissipation devices, such as a heat sink 124. Because of space limitations, though, it is not always possible to array heat sink 124 adjacent heat generating components 122.

In FIG. 2b, however, thermal solution 10 is positioned in laptop computer 120 so as to overlay both heat generating component 122 and heat sink 124. Therefore, heat can now flow from heat generating component 122 to heat sink 124 for dissipation. Moreover, because of the relatively low through-plane thermal conductivity of thermal solution 10, heat does not flow through thermal solution 10 effectively, preventing overheating of the environment shielded by thermal solution 10. This would not be possible if a more isotropic material such as copper or aluminum were used.

Moreover, because of the flexible nature of thermal solution 10, thermal solution 10 can follow the contours of the components within cell phone 120, as illustrated in FIG. 2b, thus not requiring very much additional space. Again, a more rigid material like copper or aluminum would not as easily be able to do the same.

Figure 4:
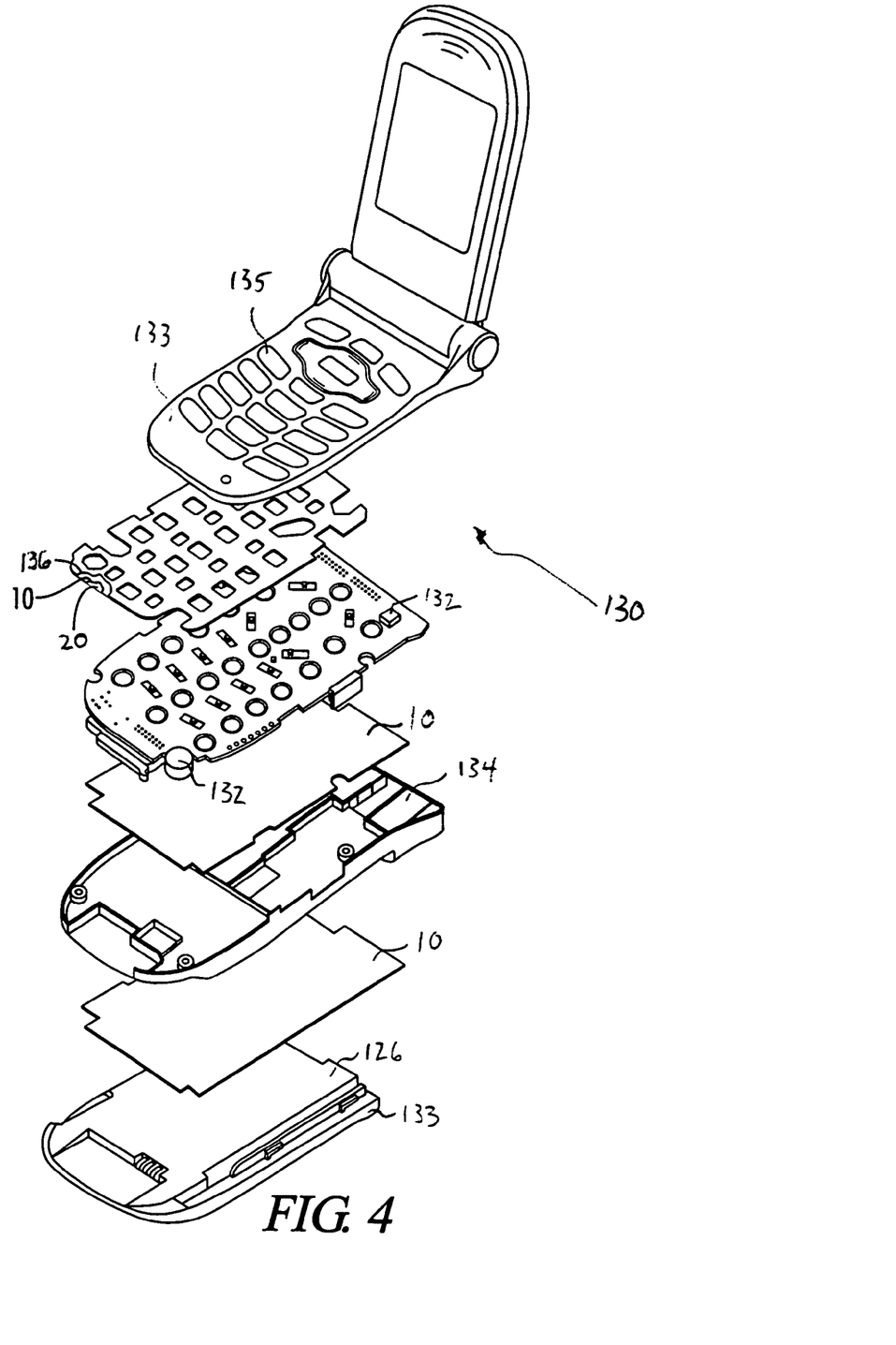
FIG. 4 is an exploded cross-sectional view of a cell phone having a plurality of embodiments of the thermal solution of the present invention contained therein.

FIG. 4 illustrates the positioning of thermal solution 10 in a cell phone 130 to accomplish the advantageous aspect of the inventive design. As seen in FIG. 4, cell phone 130 may have, within its case, a number of components, including one or more heat generating components, denoted 132. In addition, cell phone 130 may have heat dissipation devices, such as a heat sink (not shown). Because of space limitations, though, it is not always possible to array a heat sink adjacent heat generating components 122.

Thermal solution 10 is positioned in cell phone 130 in any of a variety of positions so as to overlay heat generating components 122 and, when present, a heat sink 124. Therefore, heat can now flow from heat generating component 122 to heat sink 124 for dissipation. Moreover, because of the relatively low through-plane thermal conductivity of thermal solution 10, heat does not flow through thermal solution 10 effectively, preventing overheating of the environment shielded by thermal solution 10. This would not be possible if a more isotropic material such as copper or aluminum were used.

Moreover, thermal solution 10 can prevent hot spots forming on the outer case 133 of cell phone 130, which can be uncomfortable for the user, and also shields temperature sensitive components (denoted 134) of cell phone 130 from the heat generated by heat source 122. Additionally, thermal solution 10 can be positioned between heat source 122 and the keypad 135 of cell phone 130, to shield keypad 135 from heat generated by heat source 122. In fact, thermal solution can be laminated with a reflective material 136, such as material commercially available from Toray Luminor of Japan, with reflective material 136 positioned between thermal solution 10 and keypad 135, to increase the reflectance of keypad 135.

One of the heat sensitive components in cell phone 130 can be battery 126. By arranging thermal solution 10 so as to be positioned between a heat-generating component 122 and battery 126, thermal solution 10 can shield battery 126 from the heat generated by component 122 as well as spread that heat across the surface of battery 126, thus reducing hot spots on battery 126, which can have deleterious effects.

Figure 3:
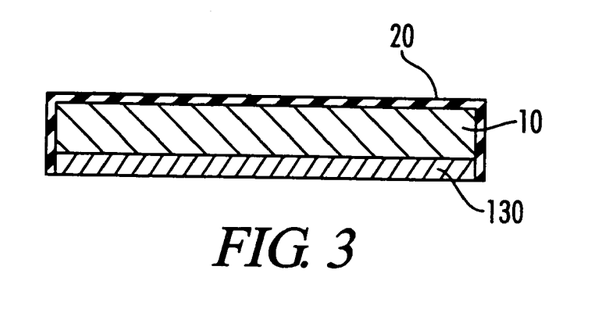
FIG. 3 is a cross-sectional view of a second embodiment of the thermal solution of the present invention having plastic and aluminum overlays.

If desired, a protective coating 20 can be applied to thermal solution 10, as illustrated in FIG. 3, to improve the handleability and mechanical robustness of thermal solution 10, and to forestall the possibility of graphite particles flaking from, or otherwise being separated from, thermal solution 10. Protective coating 20 also advantageously effectively isolates thermal solution 10, to avoid electrical interference engendered by the inclusion of an electrically conductive material (graphite) in an electronic device. Moreover, use of protective coating 20 with a relatively low thermal conductivity will increase the thermal shielding effect of thermal solution 10.

Protective coating 20 can comprise any suitable material sufficient to prevent the flaking of the graphite material and/or to electrically isolate the graphite, such as a thermoplastic material like polyethylene, a polyester or a polyimide.

Thermal solution 10, having protective coating 20 thereon, can be manufactured by several different processes. For instance, once the flexible graphite sheet is cut to size and shape to form thermal solution 10, the material from which protective coating 20 is formed can be coated on the individual thermal solution 10 to form a protective flaking boundary about thermal solution 10, as illustrated in FIG. 3. To that end, protective coating 20 can be applied by various coating methods familiar to the skilled artisan, such as spray coating, roller coating and hot laminating press. Protective coating 20 can also be applied by mechanical mapping and lamination.

Generally, the coating process adheres protective coating 20 to thermal solution 10 with sufficient strength for most applications. However, if desired, or for relatively non-adhesive protective coatings 20, such as Mylar® polyester materials and Kapton polyimide materials (both commercially available from E.I. du Pont de Nemours and Company of Wilmington, Del.), a layer of adhesive may be applied between thermal solution 10 and protective coating 20. Suitable adhesives are those which can facilitate the adhesion of protective coating 20 to thermal solution 10, such as acrylic or latex adhesives.

In another embodiment, also illustrated in FIG. 3, a material 130 to improve handleability and mechanical robustness of thermal solution 10, and to facilitate thermal transfer between heat source 100 and thermal solution 10 can be interposed between thermal solution 10 and heat source 100. One such material is a metal like copper or aluminum. Other thermal interface materials, such as those taught in International Patent Application No. PCT/US02/40238, can also be employed.

Thus, by use of the present invention, thermal shielding and thermal spreading of the heat generated by component of an electronic device, in order to dissipate the heat as well as reduce the heat transmitted to adjacent components. These functions cannot be accomplished by more traditional heat dissipation materials like copper or aluminum which, because of their isotropic natures, would do little to reduce touch temperature or the heat transmitted to adjacent components. Insulating materials which could be used to reduce touch temperature and the heat transmitted to adjacent components would not dissipate heat and result in heat build-up about the heat source component.

All cited patents, patent applications and publications referred to in this application are incorporated by reference.

The invention thus being described, it will be obvious that it may be varied in many ways. Such variations are not to be regarded as a departure from the spirit and scope of the present invention and all such modifications as would be obvious to one skilled in the art are intended to be included within the scope of the following claims.

What is claimed is:

1. A thermal dissipation and shielding system for a cell phone, comprising:
 a cell phone comprising a first component which comprises a heat source and a second component to which the first component transmits heat;

a thermal solution interposed between the first component and the second component, wherein the thermal solution comprises at least one sheet of compressed particles of exfoliated graphite which thermally shields the second component from heat generated by the first component.

2. The system of claim 1, wherein the cell phone further comprises a heat dissipation device positioned in a location not directly adjacent to the first component and further wherein one of the major surfaces of the thermal solution is in operative contact with the heat dissipation device.

3. The system of claim 2, wherein the heat dissipation device comprises a heat sink, a heat pipe, a heat plate or any combination thereof.

4. The system of claim 1, wherein the thermal solution has an in-plane thermal conductivity of at least about 140 W/m-° K.

5. The system of claim 4, wherein the thermal solution has a through-plane thermal conductivity of no greater than about 12 W/m-° K.

6. The system of claim 1, wherein the thermal solution further comprises a protective coating thereon.

7. The system of claim 6, wherein the protective coating has a thermal conductivity less than the through-plane thermal conductivity of the at least one sheet of flexible graphite.

8. The system of claim 1, wherein a thermal transfer material is positioned between the thermal solution and the first component.

9. The system of claim 8, wherein the thermal transfer material comprises a metal or a thermal interface.

10. The system of claim 1, wherein the first component comprises a power amplifier or digital signal processor of the cell phone.

11. The system of claim 1, wherein the second component comprises a battery of the cell phone.

12. The system of claim 1, wherein the second component comprises the keypad of the cell phone.

13. The system of claim 12, wherein a reflective material is positioned between the thermal solution and the keypad of the cell phone.

14. The system of claim 1, wherein the second component comprises the case of the cell phone.

15. The system of claim 1, wherein the second component comprises the display of the cell phone.

16. The system of claim 15, wherein the display is a liquid crystal display.

17. The system of claim 1, wherein the thermal solution is integral a printed circuit board of the cell phone.

* * * * *